(12) United States Patent
Wang et al.

(10) Patent No.: US 6,310,522 B1
(45) Date of Patent: Oct. 30, 2001

(54) MULTIPLE-PUSH OSCILLATOR

(75) Inventors: Huei Wang; Yu-Lung Tang, both of Taipei (TW)

(73) Assignee: Airwave Technologies Inc., Hsinchu (TW)

( * ) Notice: Subject to any disclaimer, the term of this patent is extended or adjusted under 35 U.S.C. 154(b) by 0 days.

(21) Appl. No.: 09/657,177

(22) Filed: Sep. 7, 2000

(51) Int. Cl.$^7$ .............................. H03B 5/12; H03B 21/00

(52) U.S. Cl. ......................... 331/56; 331/46; 331/117 R; 331/172

(58) Field of Search ........................ 331/46, 56, 117 R, 331/117 FE, 117 D, 172

(56) References Cited

U.S. PATENT DOCUMENTS 5,373,260 * 12/1994 Kato ........................................ 331/45

\* cited by examiner

*Primary Examiner*—David Mis
(74) *Attorney, Agent, or Firm*—Rosenberg, Klein & Lee

(57) ABSTRACT

The present invention proposes a multiple-push oscillator for providing a high-frequency signal. The multiple-push oscillator combines N (at least 3) fundamental oscillators. Through the design of circuit connection, the N fundamental oscillators will operate at odd modes with phase differences of 360/N degrees between their output currents to obtain an output signal of frequency at least three times as large as that of the fundamentals. Therefore, a high-frequency signal source can be more easily designed by the present invention. Moreover, the present invention has the characteristics of high transistor gain and high resonator Q factor.

2 Claims, 4 Drawing Sheets

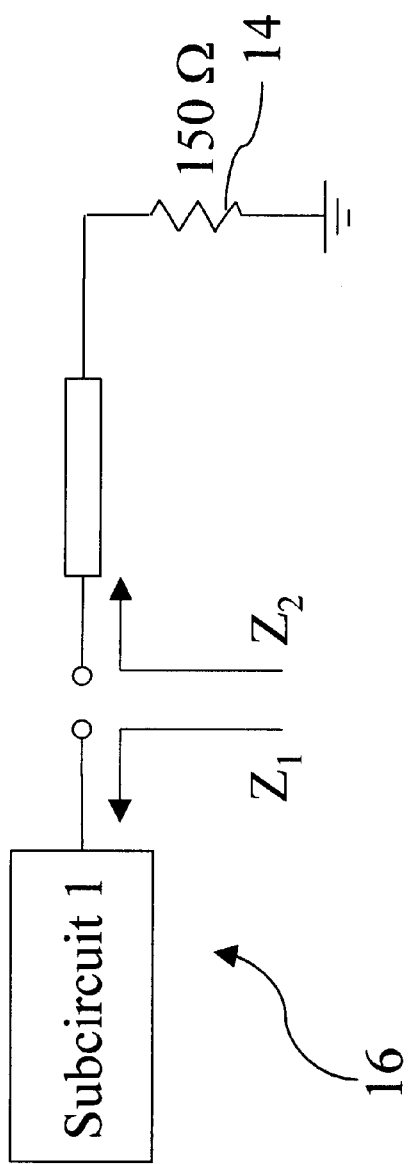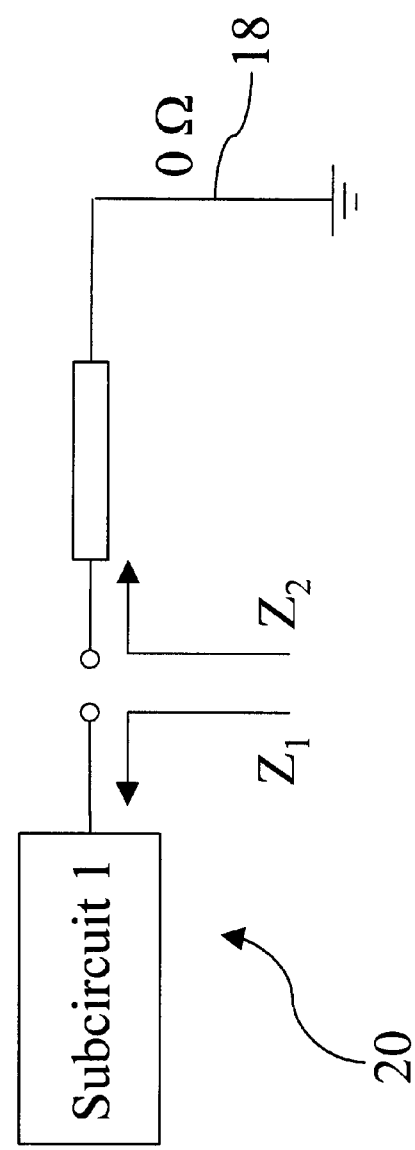

MULTIPLE-PUSH OSCILLATOR

FIELD OF THE INVENTION

The present invention relates to an improved high-frequency oscillator and, more particularly, to a multiple-push oscillator combining at least three fundamental oscillators to provide a high-frequency signal.

BACKGROUND OF THE INVENTION

In a millimeter-wave wireless communication system, the high-frequency signal source is a very important component. For instance, radar and communication systems require oscillators to provide high-frequency signals.

In prior art, the method of designing high-frequency oscillators is to use fundamental oscillators. However, when used in designing a high-frequency signal source, this method has the drawbacks of low transistor gain and low resonator quality factor (Q factor). Therefore, fundamental oscillators must be matched with frequency multipliers to provide a high-frequency signal. The oscillator of this configuration is designed to resonate at lower frequency of the output signal. Therefore, higher transistor gain and larger resonator Q factor can be obtained. However, amplifiers and filters usually are needed for oscillators of this configuration, hence resulting in large circuit area.

To overcome the drawbacks but maintain the original advantages of the fundamental oscillators, a push-push oscillator configuration has been proposed. The push-push oscillator combines two fundamental oscillators so that when the fundamentals are out of phase, the second harmonics will be in phase. Therefore, the in-phase second harmonics will combine at the output terminal, while the anti-phase fundamentals will cancel out each other. Using this configuration, the drawbacks of insufficient gain and low resonator Q factor of fundamental oscillators in high frequency range and the drawback of too large circuit area of fundamental oscillators combined with frequency multipliers can be resolved simultaneously.

The present invention aims to provide a multiple-push oscillator, which can resolve the drawbacks of insufficient gain and low resonator Q factor more easily than a fundamental oscillator or a push-push oscillator does.

SUMMARY AND OBJECTS OF THE PRESENT INVENTION

The primary object of the present invention is to provide a multiple-push oscillator, which uses phase differences to suppress fundamentals and second harmonics thereof so that the output of third harmonics can be increased.

Another object of the present invention is to provide a multiple-push oscillator having the advantages of high transistor gain, high resonator Q factor, and low phase noise.

According to the present invention, a triple-push oscillator combines three fundamental oscillators. Through the design of circuit connection, the three fundamental oscillators will operate at odd modes with phase differences of 120 degrees among their output currents. Thereby, an output of third harmonics interfering constructively can be obtained, while the fundamentals and the second harmonics are suppressed for the combined triple-push oscillator, hence raising the frequency of the output signal to be three times as large as that of the fundamentals.

The various objects and advantages of the present invention will be more readily understood from the following detailed description when read in conjunction with the appended drawings, in which:

BRIEF DESCRIPTION OF DRAWING

FIG. 2A is a circuit schematic diagram when the present invention is operated at even modes;

FIG. 2B is a circuit schematic diagram when the present invention is operated at odd modes;

DETAILED DESCRIPTION OF PREFERRED EMBODIMENT

The present invention is characterized in that a multiple-push oscillator combining at least three fundamental oscillators is operated to have odd-mode output, hence obtaining an oscillator having an output of frequency at least three times as large as that of the fundamentals. A multiple-push oscillator having three fundamental oscillators will be described below to illustrate the functions and characteristics the present invention.

Figure 1:
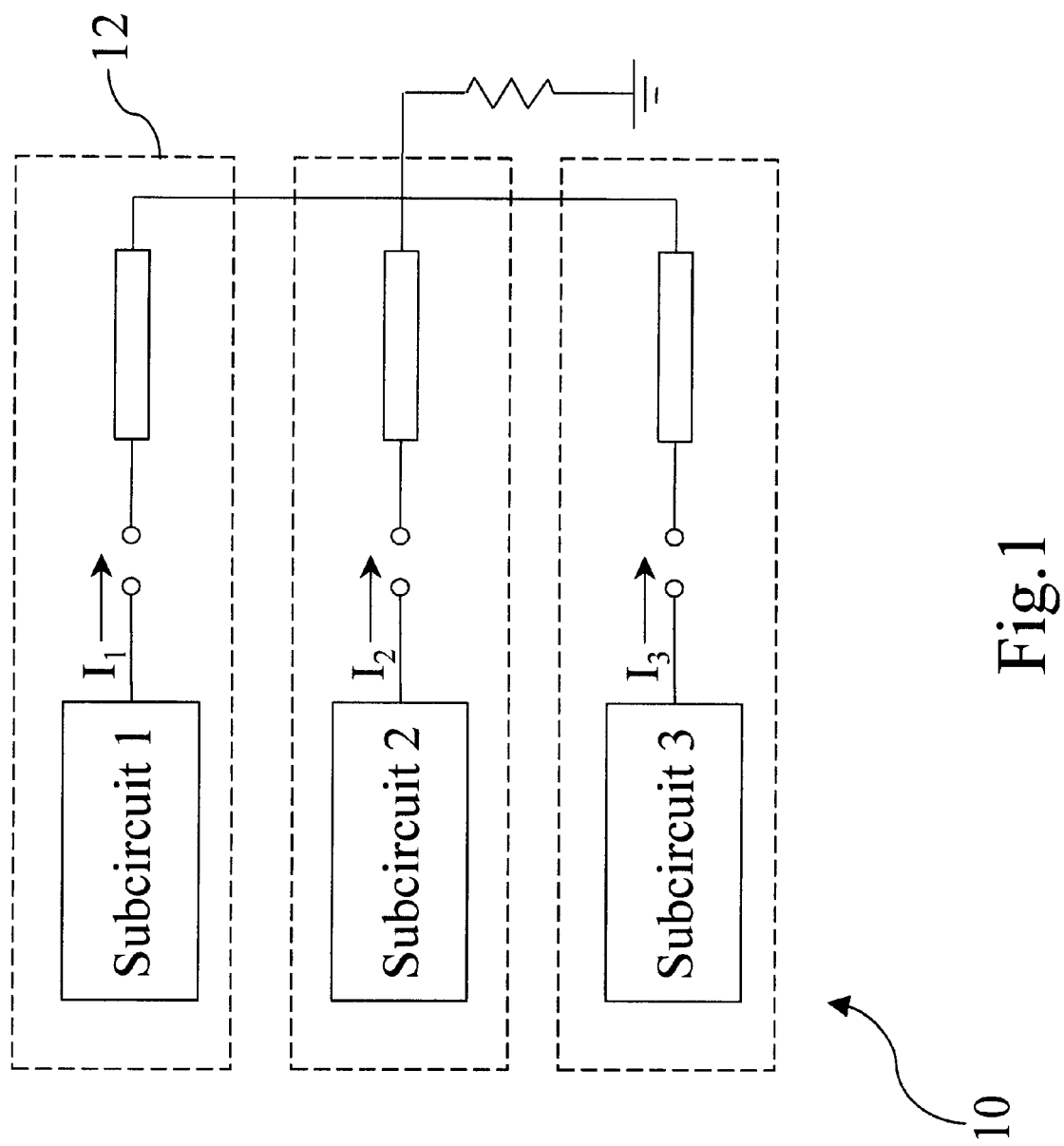
FIG. 1 is a schematic diagram of the present invention.

A multiple-push oscillator having three fundamental oscillators can be called a triple-push oscillator 10, as shown in FIG. 1. The triple-push oscillator 10 combines three fundamental oscillators 12. Through the design of circuit connection, the three fundamental oscillators 12 will operate at odd modes with phase differences of 120 degrees between their output currents. Thereby, an output of third harmonics interfering constructively can be obtained, while the fundamentals and second harmonics are suppressed for the combined triple-push oscillator 10, hence raising the frequency of the output signal to be three times as large as that of the fundamentals. Based on mathematical analysis, in the circuit configuration of the above triple-push oscillator, three modes of current ($I_1$, $I_2$, and $I_3$) exist, one being an even mode, the other two being odd modes. The even mode (1,1,1) is a mode of which the output currents $I_1$, $I_2$, and $I_3$ of the three fundamental oscillators are in phase. The odd modes ($e^{j0}, e^{j^2/_3\pi}, e^{j^4/_3\pi}$) and ($e^{j0}, e^{-j^2/_3\pi}, e^{-j^4/_3\pi}$) are the modes of which the output currents $I_1$, $I_2$, and $I_3$ of the three fundamental oscillators have phase differences of 120 degrees between one another. If the even mode is suppressed while the odd modes are excited, there will be phase differences of 120 degrees between the fundamentals, hence canceling out the fundamentals. The second harmonics will also be canceled out because of phase differences of 240 degrees between one another. Only the third harmonics will interfere constructively to obtain an output signal of frequency three times as large as that of the fundamentals.

For the circuit to function, the even mode must be excited, while the odd modes must be excited. Therefore, when performing linear analysis, the even mode must not satisfy the oscillation condition, while the odd modes must satisfy the oscillation condition. When analyzing the oscillation condition of the even mode, because the output currents of the three fundamental oscillators are in phase, the whole triple-push oscillator can be viewed as a fundamental oscillator plus an even-mode circuit 16 having a 150-Ω even-mode circuit load terminal 14, as shown in FIG. 2A. The circuit is then divided into two parts to let the impedances not satisfy the oscillation condition. When analyzing the oscillation condition of the odd modes, because the output currents of the three fundamental oscillators have phase differences of 120 degrees between one another (i.e., $I_1+I_2+I_3=0$), the whole triple-push oscillator can be viewed as a fundamental oscillator plus an odd-mode circuit 20 having a 0 -Ω odd-mode circuit load terminal 18, as shown in FIG. 2B. The circuit is then divided into two parts to let the impedances satisfy the oscillation condition, i.e., Re[$Z_1+Z_2$] <0 and Im[$Z_1+Z_2$]=0.

Because the frequency of the output signal of the above triple-push oscillator depends mainly on the frequency of a single fundamental oscillator, the frequency of the output signal can be obtained by multiplying the frequency of the fundamentals by 3. Moreover, the fundamentals will cancel out one another because of phase differences of 120 degrees so that no external filtering circuit is required. In other words, a single triple-push oscillator can achieve the functions of an oscillator, a triple frequency multiplier, and a filter. Therefore, the same effects can be achieved through a simpler structure and a smaller circuit area. A high-frequency signal source can thus be more easily designed by the present invention than by a fundamental oscillator or a push-push oscillator in prior art. Moreover, the present invention can achieve the effects of high transistor gain, high resonator Q factor, and low phase noise simultaneously.

Figure 3:
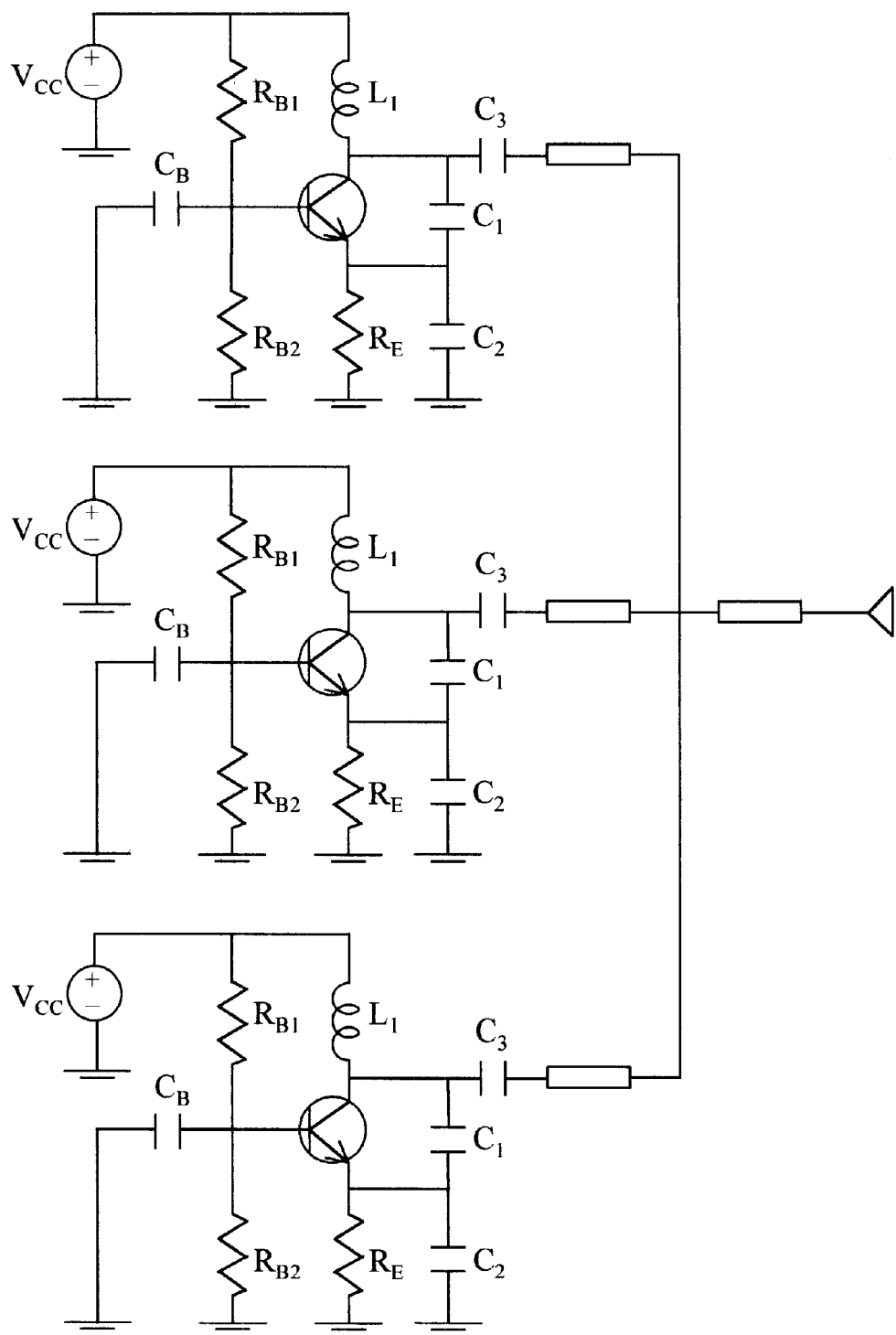
FIG. 3 is a circuit diagram according to an embodiment of the present invention.
Figure 4:
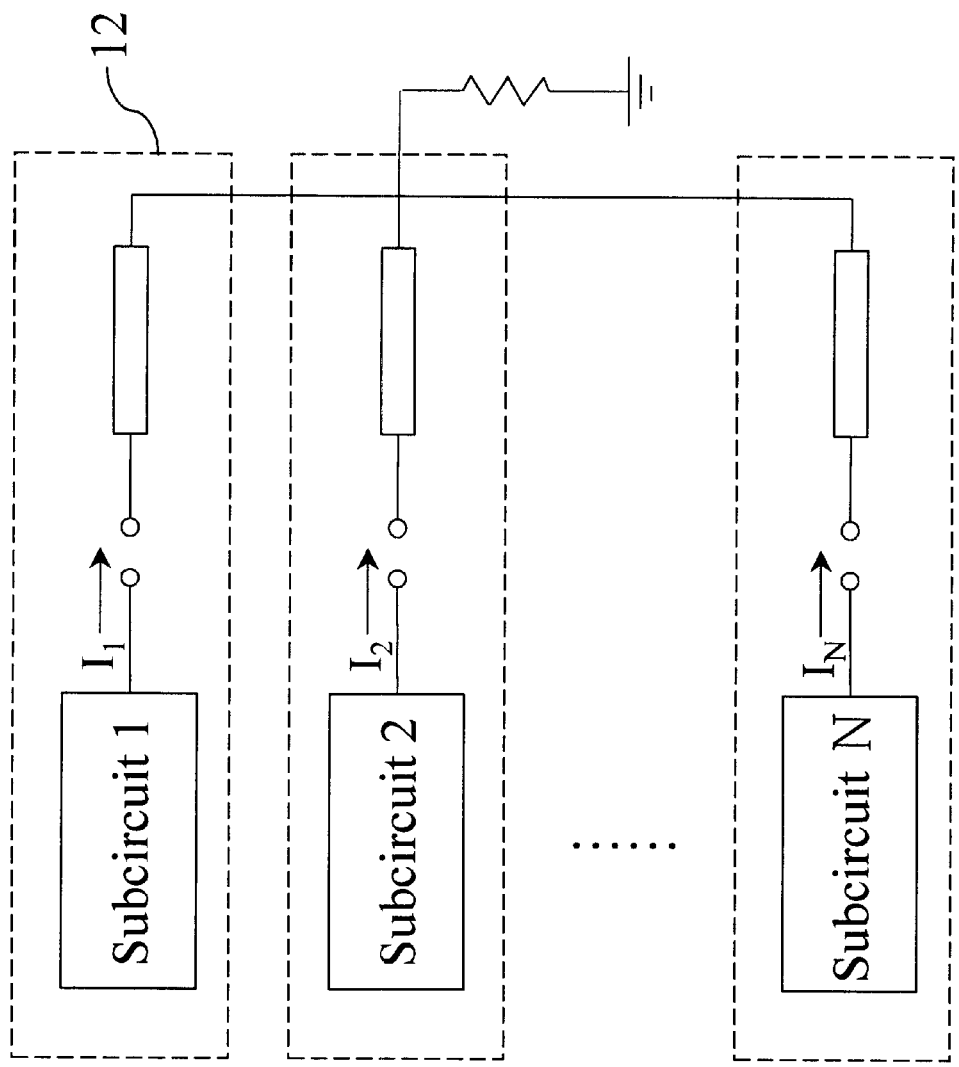
FIG. 4 is a schematic diagram of the present invention having N fundamental oscillators.

As shown in FIG. 3, a 4.86 GHz triple-push oscillator is formed by combining three identical fundamental oscillators. Each fundamental oscillator comprises capacitors $C_B$, $C_1$, $C_2$, and $C_3$, resistors $R_E$, $R_{B1}$, and $R_{B2}$, and an inductor $L_1$. The capacitors $C_B$, $C_1$, and $C_2$ are used to generate the negative impedance of the circuit and determine the oscillation frequency. The resistor $R_E$ is used to determine the bias point and stabilize the DC currents. The capacitor $C_3$ is a coupling capacitor for blocking DC. The inductor $L_1$ is used to isolate RF signals. The resistors $R_{B1}$ and $R_{B2}$ are used to bias the circuit at the bias point: $V_{cc}$=3.1V, $I_c$=17 mA. The used active components, bipolar transistors BFG540, are manufactured by the Philips. The values of the components are $C_1$=0.5 pF, $C_2$=0.5 pF, $C_3$=12 pF, $C_B$=4 pF, $L_1$=107 nH, $R_E$=51 Ω, $R_{B1}$=3000 Ω, and $R_{B2}$=3000 Ω.

The measured results of the triple-push oscillator shown in FIG. 3 are summarized in the following table:

|  |  | Frequency (GHz) | Output power (dBm) |
|---|---|---|---|
| Measured results | Fundamental signal | 1.62 | −11.00 |
|  | Second harmonic | 3.24 | −14.50 |
|  | Third harmonic | 4.86 | 1.67 |

As can be seen from the above table, the fundamentals oscillate at 1.62 GHz. Because the triple-push oscillator will operate at the odd modes of which the output currents of the three fundamental oscillators have phase differences of 120 degrees among one another, the fundamentals will cancel out one another. Contrarily, the third harmonics will interfere constructively to obtain a 4.86 GHz output signal of 1.67 dBm power. The powers of the fundamentals and the second harmonics will be suppressed to be only −11 dBm and −14.5 dBm, respectively. Therefore, the triple-push oscillator can exactly output a signal of frequency three times as large as that of the fundamentals.

Except comprising three fundamental oscillators, a multiple-push oscillator of the present invention can have more than three fundamental oscillators to raise the frequency of the output signal to be more than three times as large as that of the fundamentals. A multiple-push oscillator comprises N fundamental oscillators 12 to operate at the odd mode of which the output currents of the N fundamental oscillators have phase differences of 360/N degrees so that an output signal of frequency N times as large as that of the fundamentals can be exactly obtained.

Although the present invention has been described with reference to the preferred embodiments thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

We claim:

1. A multiple-push oscillator comprising N fundamental oscillators and used to provide a high-frequency signal, N being at least 3, output currents of odd-mode oscillation of said N fundamental oscillators being excited to obtain an output signal of frequency N times as large as that of the fundamentals through the design of circuit connection.

2. The multiple-push oscillator as claimed in claim 1, wherein said multiple-push oscillator comprises N oscillators and operates at odd mode of which the output currents of said N fundamental oscillators have phase differences of 360/N degrees.

* * * * *